United States Patent [19]

Morcom et al.

[11] 4,210,925
[45] Jul. 1, 1980

[54] I²L INTEGRATED CIRCUIT AND PROCESS OF FABRICATION

[75] Inventors: William R. Morcom, Melbourne Beach; Hugh C. Nicolay, Melbourne Village; Eugene R. Cox, Palm Bay, all of Fla.

[73] Assignee: Harris Corporation, Melbourne, Fla.

[21] Appl. No.: 875,824

[22] Filed: Feb. 7, 1978

[51] Int. Cl.² .................................. H01L 27/02
[52] U.S. Cl. .............................. 357/46; 357/49; 357/55; 357/92
[58] Field of Search ................... 357/92, 46, 49, 55

[56] References Cited
U.S. PATENT DOCUMENTS

| | | | |
|---|---|---|---|
| 3,993,513 | 11/1976 | O'Brien | 357/92 |
| 4,082,571 | 4/1978 | Graul et al. | 357/92 |
| 4,140,559 | 2/1979 | Van Vonno | 357/92 |

*Primary Examiner*—Edward J. Wojciechowicz
*Attorney, Agent, or Firm*—Leitner, Palan, Lyman, Martin & Bernstein

[57] ABSTRACT

In a complementary pair of bipolar transistors, one vertical and one lateral, the vertical transistor includes a heavily doped buried emitter, lightly doped buried graded base and a heavily doped surface collector and the lateral transistor includes a lightly doped substrate base and heavily doped emitter and collector. The lateral transistor's collector isolates the lateral transistor's base from the vertical transistor's collector.

This integrated circuit approach includes the I²L structure of the present invention and T²L devices. The I²L transistors are in dielectrically isolated regions with the vertical transistors emitter being connected to the polycrystalline support through a vertical opening in the dielectric isolation.

The process of fabrication includes forming the vertical transistor's base by diffusion into a first surface of a substrate of opposite conductivity type, forming the vertical transistor's emitter epitaxially on the first surface and forming the vertical transistor's collector and the lateral transistor's emitter and collector by diffusion into the opposite surface of the substrate. The lateral transistor's collector diffusion is from the opposite surface down to the vertical transistor's base and separates the vertical transistor 's collector from the portion of the substrate which is the lateral transistor's base.

For integrated circuits, the process includes dividing the substrate into a plurality of dielectrically insulated regions after forming the epitaxial emitter and depositing a polycrystalline support.

18 Claims, 8 Drawing Figures

FIG.6
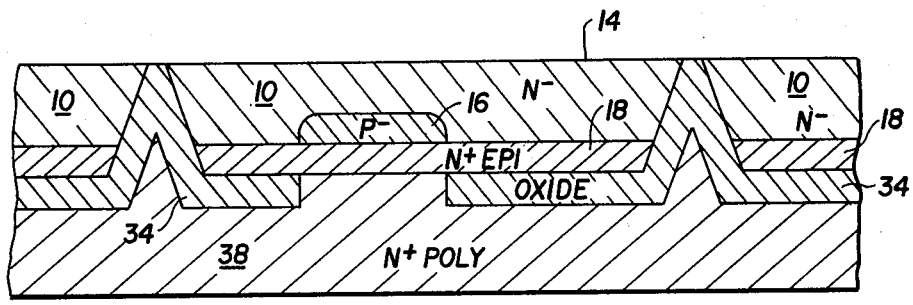
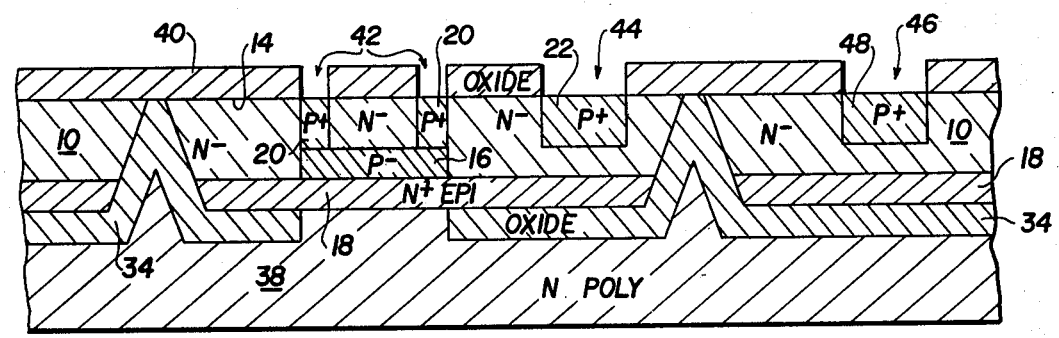
FIG.7
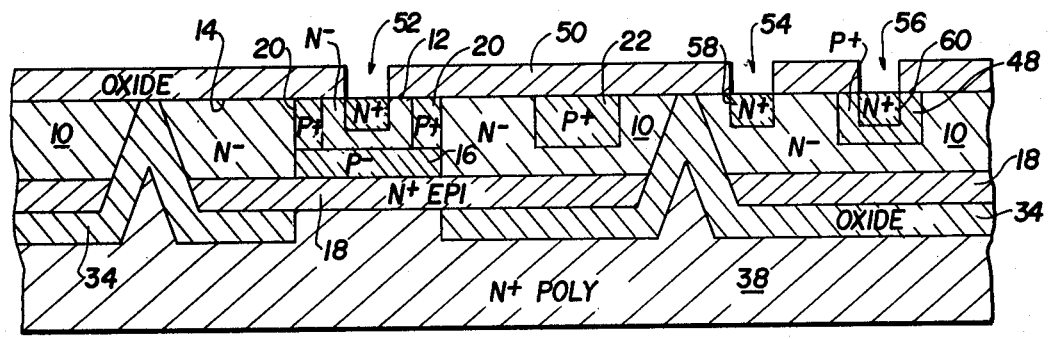
FIG.8

I²L INTEGRATED CIRCUIT AND PROCESS OF FABRICATION

BACKGROUND OF THE INVENTION

The present invention relates generally to bipolar integrated circuits and more particularly to integrated injection logic (I²L).

The use of merged transistor logic or integrated injection logic (I²L) has made possible high packing density of low power integrated circuits. The standard I²L structure is an NPN device with an active PNP load fabricated such that the collector of the PNP and the base of the NPN share the same semiconductor region and the base of the PNP and the emitter of the NPN are common. The structures of the prior art have generally not provided both transistors having a high gain or Beta. Similarly, the particular structure and method of fabrication of I²L structure of the prior art have not permitted their effective use with transistor to transistor logic (T²L). Thus there exists a need for an I²L structure which is simple to manufacture and provides complementary transistors both with high current gains and in an integrated circuit which allows compatibility with T²L devices.

SUMMARY OF THE INVENTION

The present invention is an I²L structure of bipolar transistors including a vertical and a lateral transistor. The vertical transistor includes a heavily doped emitter region formed on a lightly doped substrate of the same conductivity type, a lightly doped graded base region in the substrate in direct contact with the epitaxial emitter region and a heavily doped collector region formed in the opposite surface of the substrate and having the same conductivity type. The lateral transistor includes heavily doped emitter and collector regions formed in the opposite surface of the substrate where the collector acts to separate the portion of the substrate which forms the base of the lateral transistor from the heavily doped collector region of the vertical transistor.

The I²L transistors of the present invention may be included in an integrated circuit wherein the lightly doped substrate is divided into a plurality of dielectrically isolated areas which may include other I²L and T²L bipolar transistors. The support structure of the plurality of dielectrically isolated substrate regions is a heavily doped polycrystalline material of the same conductivity type as the substrate. The heavily doped epitaxial layer or the emitter region of the vertical transistor is connected to the heavily doped substrate through an opening in the dielectric insulated layer so as to interconnect the emitters of the vertical transistors. The opening may be vertically aligned with the base of the vertical transistor.

The process of fabrication of the I²L structure of the present invention begins with diffusing impurities of first conductivity type into a single crystal substrate of a second conductivity type to form the graded base of the vertical transistor. The diffused region and the substrate are both lightly doped. A heavily doped epitaxial layer is grown on the surface of the substrate into which the base is diffused to form an emitter region of the vertical transistor. Impurities are then diffused in the opposite or second surface of the substrate to form the emitter and collector regions of the lateral transistor with the collector diffusing down to the diffused base region of the vertical transistor. Impurities are then diffused into the second surface of the substrate to form a heavily doped collector region of the same conductivity type as the substrate. The collector region of the lateral transistor separates the base portion of the substrate of the lateral transistor from the collector region of the vertical transistor.

The present process may be used to form integrated circuits having I²L structures and T²L devices. The above process is modified wherein the substrate is divided into a plurality of regions dielectrically isolated. The dielectric isolation is performed after the formation of the heavily doped epitaxial layer. Openings are provided in the dielectric isolation before formation of the heavily doped polycrystalline support layer so as to interconnect all of the emitter regions of the vertical transistors through the support layer of the same conductivity type. The process steps used to form the emitter of the lateral transistor can also be used to form a base of a T²L transistor in other diectrically isolated regions and the step used to form the collector of the vertical transistor can be used to form the collector and emitter of a T²L bipolar transistor.

OBJECTS OF THE INVENTION

An object of the present invention is to provide an improved I²L semiconductor structure.

Another object is to provide an I²L structure wherein both transistors have a high current gain or Beta.

A further object of the invention is to provide an I²L structure wherein the buried emitter of the vertical transistor is in direct contact with a graded buried base region.

Still another object of the invention is to provide an integrated circuit having dielectric isolation and including improved I²L structure in combination with T²L devices.

Other objects, advantages, and novel features of the invention will become apparent from the following detailed description of the invention when considered in conjunction with the accompanying drawings.

BRIEF DESCRIPTION OF THE DRAWINGS

FIGS. 3-8 are cross-sectional views illustrating the different stages of the process of fabrication of an integrated circuit having isolated I²L structures and T²L devices incorporating in the principles of the present invention.

DESCRIPTION OF THE PREFERRED EMBODIMENTS

Figure 1:
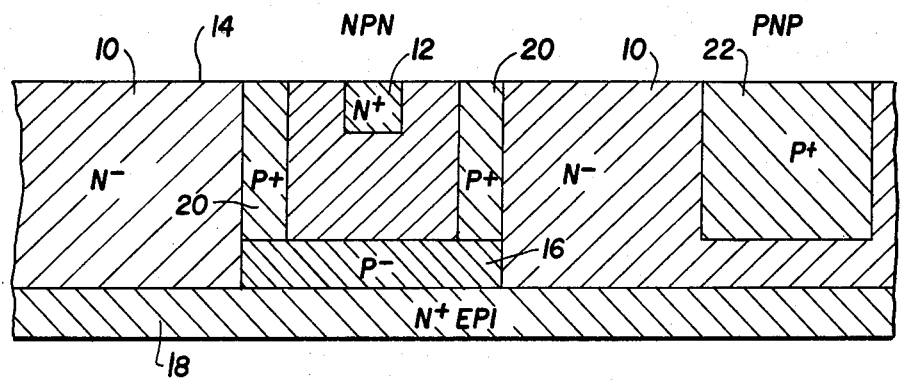
FIG. 1 is a cross-sectional view of a structure of an I²L structure incorporating the principles of the present invention.

FIG. 1, which illustrates a preferred embodiment of the I²L structure shows a vertical NPN device formed in a lightly doped N− substrate 10 and including a heavily doped N+ collector 12 formed in surface 14 of the substrate, a lightly doped graded P− base 16 and a heavily doped N+ epitaxial emitter 18. A lateral PNP transistor is also formed in the substrate 10 having a heavily doped P+ collector 20 and a heavily doped P+ emitter 22 formed in the top surface 14 of substrate 10 and a base region formed from the lightly doped N− substrate region 10. The P− base region 16 of the vertical NPN transistor is graded having a heavier doped region adjacent to the N+ epitaxial emitter region 18 and decreasing toward surface 14. P+ region 20 which is the collector of the lateral PNP transistor separates the N+ collector region 12 from the portion of the N− substrate 10 which forms the base of the lateral transistor. Also heavily doped P+ region 20 provides surface contact areas for the buried lightly doped P− base region 16 of the vertical transistor.

Figure 2:
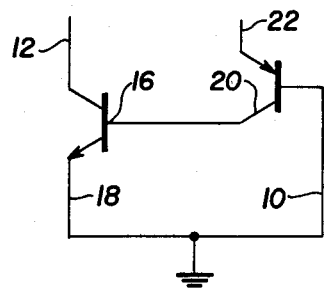
FIG. 2 is a schematic diagram of the I²L structure of FIG. 1.
Figure 3:
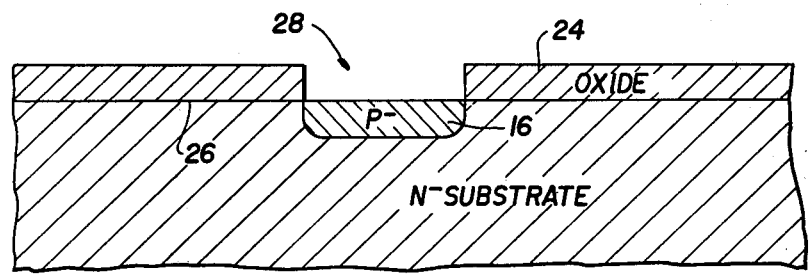
Figure 4:
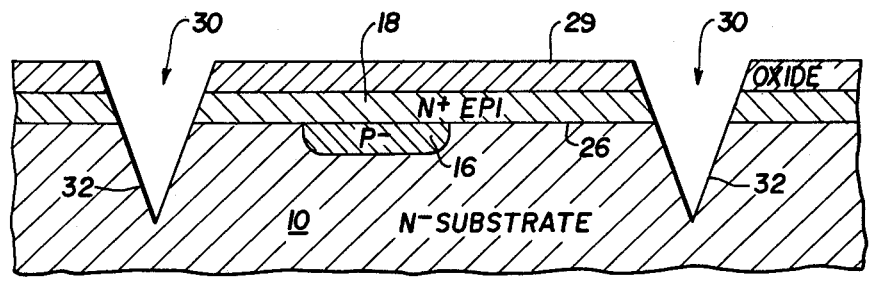
Figure 5:
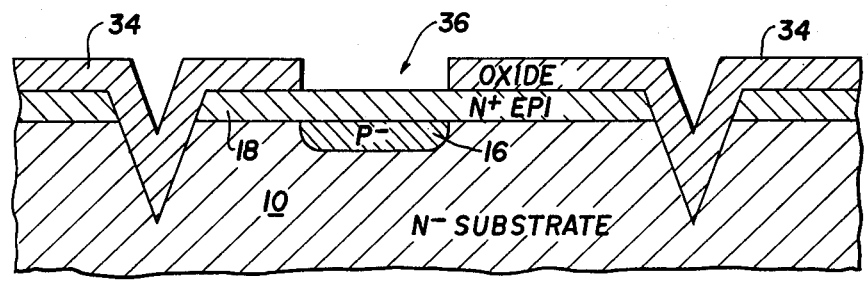

The schematic view of FIG. 2 illustrates that the collector 12 of the NPN transistor and the emitter region 22 of the PNP transistor provide terminals for the I²L structure with the emitter region 18 and the base region 10 of the NPN and PNP transistors respectively being commonly connected and grounded. Base region 16 of the NPN transistor and the collector region of the PNP transistor are commonly connected in the semiconductor material.

The high current gain or Beta of the NPN transistor results from the high concentration of emitter region 18 and that it is in intimate contact with a graded base region 16 in such a matter to aid the flow of carriers across the base region 16. The PNP transistor achieves increased current gain or Beta because of the good lifetimes produced by the single crystal base region 10.

The I²L structure, illustrated in FIG. 1, may be part of an intergrated circuit including a T²L structure formed in a dielectrically isolated substrate region. The process for forming the dielectric isolation and the I²L structure and T²L device of the present invention is illustrated in FIGS. 3–8. The process begins with a substrate 10 having a masking material, for example, an oxide 24 formed on a first surface 26 and an opening 28 formed therein by standard photolithographic operations for the buried base region 16 of the NPN transistor. Impurities, for example, boron are diffused into surface 26 through opening 28 by ion implantation or deposition. The P− region 16 will have an impurity concentration, for example, $5 \times 10^{17}$ atoms/cc in a substrate having impurity concentration of $1 \times 10^{16}$ atoms/cc. The oxide layer 24 is then removed and an N+ epitaxial region 18 is grown on surface 26. Substrate 10 being a single crystal structural produce an epitaxial layer 18 of single crystal structure and layer 18 will have impurity concentration of, for example, $1 \times 10^{21}$ atoms/cc.

A masking layer, for example, oxide 29 is grown on the epitaxial layer 18 and delineated by standard photolithographic processes to form openings 30 in the mask layer 29. The epitaxial layer 18 and the substrate 10 are then etched to form the V-shape moats 32 illustrated in FIG. 4. Oxide layer 29 is then removed and a new layer of oxide 34 is grown over the epitaxial layer 18 and in the moats 32. Opening 36 is formed in the oxide layer 34 which may be vertically aligned and have horizontal dimensions substantially equal to the horizontal dimensions of the P− base region 16. It should be noted that even though a single base region 16 is shown, opening 36 in oxide layer 34 is formed for each substrate region having a base region 16. A highly doped N+ polycrystalline material is deposited over the oxide layer 34 into opening 36 to provide a support 38 for the substrate. The opposite surface 26 of the substrate is then polished down to the bottom of the moats 32 to define a surface 14 and to divide the substrate 10 into a plurality of dielectrically isolated regions on a support 38. This is illustrated in FIG. 6.

It should be noted that forming region 16 by diffusing impurities into layer 26 and later placing a high impurity N+ region thereon, the base region 16 is in intimate contact with the emitter of the NPN transistor and has a graded impurity concentration which is heaviest at the emitter and which decreases towards the collector region.

A masking layer, for example, oxide 40 is grown on surface 14 of the substrate 10 and openings 42, 44 and 46 are formed therein. Boron, for example, is deposited and diffused through the openings 42, 44 and 46 to form collector region 20 and emitter region 22 of the I²L structure and a base region 48 of a T²L device, respectively. The resulting regions have an impurity concentration, for example, $5 \times 10^{18}$ atoms/cc. The collector region 20 is formed to a depth sufficient to contact the buried P− region 16 and to separate the subsequent to be formed collector region of the NPN transistor from the base region of the lateral PNP transistor. The device at this stage is illustrated in FIG. 7.

The oxide mask 40 and oxide formed during diffusion is removed and a new oxide layer 50 is formed thereon with openings 52, 54 and 56 delineated therein. An N+ dopant, for example, phosphorous, is deposited and diffused through openings 52, 54 and 56 to form a collector region 12 for the I²L structure and collector and emitter regions 58 and 60 for the T²L device, respectively having an impurity concentration, for example, of $1 \times 10^{21}$ atoms/cc. The structure at this point in the process is illustrated in FIG. 8. Oxide is then formed over the substrate and openings provided thereon for the required surface interconnects.

The integrated circuit illustrated in FIG. 8 includes an I²L structure and a T²L device in dielectrically isolated regions. The I²L structures are interconnected on the surface as well as through the openings in the dielectric isolation 34 and the heavily doped N+ polycrystalline support 38. Although a single I²L structure is shown formed in a dielectrically isolated region, a plurality of such structures may be formed in a single dielectrically isolated region.

From the preceding description of the preferred embodiments, it is evident that the objects of the invention are obtained and although the invention has been described and illustrated in detail, it is to be clearly understood that the same is by way of illustration and example only and is not to be taken by way of limitation. The impurities may be reversed such that the complementary pair of transistors for the I²L structure may be formed in a P-type substrate. The spirit and scope of this invention are to be limited only by the terms of the appended claims.

What is claimed:

1. A complementary pair of bipolar transistors including a vertical and a lateral transistor comprising:

a substrate of a first conductivity type having separate portions forming the base of said lateral transistor and collector of said vertical transistor;

an epitaxial emitter region of said vertical transistor of said first conductivity type at a first surface of and distinct from said substrate;

a base region of said vertical transistor of a second conductivity type opposite said first conductivity type extending into said substrate from said first surface and said epitaxial emitter region;

a collector region of said vertical transistor of said first conductivity type being more heavily doped than and extending into said substrate portion which forms said collector from a second surface opposite said first surface;

an emitter region of said lateral transistor of said second conductivity type extending into said substrate from said second surface; and a collector region of said lateral transistor of said second conductivity type extending from said second surface to said base region of said vertical transistor.

2. The transistors according to claim 1 wherein said collector region of said lateral transistor separates said collector region of said vertical transistor from the portion of said substrate which constitutes the base region of the lateral transistor.

3. The transistors according to claim 1 wherein said base region of said vertical transistor is graded and lightly doped and said epitaxial emitter region of said vertical transistor is heavily doped.

4. The transistor according to claim 1 wherein said base region of said vertical transistor has a graded impurity concentration with the heavier concentration being at the boundary with said epitaxial emitter region of said vertical transistor.

5. The transistor according to claim 1 wherein said substrate is a lightly doped single crystal material and said emitter and collector regions of said lateral transistor are heavily doped.

6. An intergrated circuit having $I^2L$ and $T^2L$ bipolar transistors comprising:
   a plurality of dielectrically isolated substrate regions of a first conductivity type;
   a $T^2L$ bipolar transistor formed in a first dielectrically isolated substrate region;
   an $I^2L$ structure formed in a second dielectrically isolated substrate region which includes a lateral transistor and complementary vertical transistor;
   a region of said first conductivity type at a first buried surface of said substrate forming the emitter region of said vertical transistor;
   a region of a second conductivity type opposite said first conductivity type extending into said substrate from said first surface forming the base region of said vertical transistor;
   a region of said first conductivity type extending into said substrate from a second surface opposite said first surface forming the collector region of said vertical transistor;
   said second substrate region forming the base of said lateral transistor;
   a region of said second conductivity type extending into said substrate from said second surface forming the emitter region of said lateral transistor; and
   a region of said second conductivity type extending from said second surface to said base region of said vertical transistor forming the collector region of said lateral transistor.

7. The integrated circuit according to claim 6 wherein said dielectrically isolated regions are supported by a polycrystalline layer of said first conductivity type, and said emitter region of said vertical transistor is connected to said polycrystalline layer through an opening in said dielectric isolation adjacent said base region of said vertical transistor.

8. The integrated circuit according to claim 7 including a plurality of $I^2L$ structures formed in dielectrically isolated regions, each $I^2L$ structure includes a buried epitaxial emitter region of a vertical transistor connected to said polycrystalline layer through an opening in said dielectric isolation.

9. The integrated circuit according to claim 8 wherein each of said openings in said dielectric isolation is vertically aligned with said base region of said vertical transistor.

10. The integrated circuit according to claim 6 wherein said collector region of said lateral transistor separates said collector region of said vertical transistor from the portion of said substrate which constitutes the base region of the lateral transistor.

11. The integrated circuit according to claim 6 wherein said base region of said vertical transistor is lightly doped and said emitter region of said vertical transistor is a heavily doped epitaxial layer.

12. The integrated circuit according to claim 6 wherein said base region of said vertical transistor has a graded impurity concentration with the heavier concentration being at the boundary with said emitter region of said vertical transistor.

13. The integrated circuit according to claim 6 wherein said substrate is a lightly doped single crystal material and said emitter and collector regions of said lateral transistor are heavily doped.

14. An integrated circuit having $I^2L$ and $T^2L$ bipolar transistors comprising:
   a support of a first conductivity type;
   a plurality of spaced regions of said first conductivity type in a first surface of said support and dielectrically isolated from said support and each other;
   at least one $T^2L$ bipolar transistor formed in a first dielectrically isolated spaced region;
   at least two $I^2L$ structures formed in a second and third dielectrically isolated spaced region respectively;
   said $I^2L$ structures each include a vertical and lateral transistor;
   said vertical transistors each have a surface collector region of said first conductivity type in a portion of said spaced region forming part of the collector, a buried base region of a second conductivity type opposite said first conductivity type and a buried emitter region of said first conductivity type distinct from said spaced region and in intimate contact with the bottom of said buried base region;
   each of said buried emitter regions being connected to said support through a respective opening in the dielectric isolation.

15. The integrated circuit according to claim 14 wherein each of said openings in said dielectric isolation has substantially the horizontal dimension of said base region of said vertical transistor and is vertically aligned therewith.

16. The integrated circuit according to claim 14 wherein said base region of said vertical transistor has a graded impurity concentration with the heavier concentration being at the boundary with said emitter region of said vertical transistor which is an epitaxial.

17. The integrated circuit according to claim 14 wherein said second dielectrically isolated region includes a plurality of $I^2L$ structures having a common buried emitter region.

18. An intergrated circuit having $I^2L$ and $T^2L$ bipolar transistors comprising:
   a plurality of dielectrically isolated substrate regions of a first conductivity type;
   a $T^2L$ bipolar transistor formed in a first dielectrically isolated substrate region;

an I²L structure formed in a second dielectrically isolated substrate region which includes a lateral transistor and complementary vertical transistor;

a region of said first conductivity type at a first buried surface of said second substrate region forming the emitter region of said vertical transistor;

a region of a second conductivity type opposite said first conductivity type extending into said substrate from said first surface and said emitter region forming the base region of said vertical transistor;

a region of said first conductivity type being more heavily doped than and extending into a portion of said second substrate region from a a second surface opposite said first surface forming with said substrate portion the collector region of said vertical transistor;

said second substrate region forming the base of said lateral transistor;

a region of said second conductivity type extending into said second substrate region from said second surface forming the emitter region of said lateral transistor; and a region of said second conductivity type extending from said second surface to said base region of said vertical transistor forming the collector region of said lateral transistor.

* * * * *

UNITED STATES PATENT AND TRADEMARK OFFICE
CERTIFICATE OF CORRECTION

PATENT NO. : 4,210,925

DATED : July 1, 1980

INVENTOR(S) : William R. Morcom, et al

It is certified that error appears in the above-identified patent and that said Letters Patent are hereby corrected as shown below:

Column 2, line 19, delete "diectrically", add -- dielectrically-

Column 3, line 21, delete "matter", add -- manner --

Column 3, line 26, delete "intergrated", add -- integrated --

Column 3, line 42, delete "structural produce", add -- structure produces --

Claim 6, Delete Claim 6 in its entirety

Claim 7, first line, delete "6", add -- 18 --

Claim 10, first line, delete "6", add -- 18 --

Claim 11, first line, delete "6", add -- 18 --

Claim 12, first line, delete "6", add -- 18 --

Claim 13, first line, delete "6", add -- 18 --

UNITED STATES PATENT AND TRADEMARK OFFICE
CERTIFICATE OF CORRECTION

PATENT NO. : 4,210,925
DATED : July 1, 1980
INVENTOR(S) : William R. Morcom, et al It is certified that error appears in the above-identified patent and that said Letters Patent are hereby corrected as shown below:

Claim 16, last line, after the word "epitaxial", insert "layer"

Claim 18, first line, delete "intergrated", add -- integrated --

Signed and Sealed this

Ninth Day of December 1980

[SEAL]

Attest:

SIDNEY A. DIAMOND

Attesting Officer

Commissioner of Patents and Trademarks